United States Patent [19]

Caspari

[11] Patent Number: 4,517,683
[45] Date of Patent: May 14, 1985

[54] MICROPROCESSOR CONTROLLED SYSTEM FOR DECODING SERIAL DATA INTO PARALLEL DATA FOR EXECUTION

[75] Inventor: Fred W. Caspari, South Bend, Ind.

[73] Assignee: Magnavox Consumer Electronics Company, Knoxville, Tenn.

[21] Appl. No.: 336,134

[22] Filed: Dec. 31, 1981

[51] Int. Cl.³ .......................................... H03K 13/24
[52] U.S. Cl. .................... 375/117; 375/94; 371/6
[58] Field of Search ............ 375/94, 95, 107, 113, 375/106, 116, 117; 371/6, 42, 47, 55; 340/347 DD; 364/900

[56] References Cited

U.S. PATENT DOCUMENTS

| | | | |
|---|---|---|---|
| 3,753,228 | 8/1973 | Nickolas et al. | 371/47 |
| 4,101,732 | 7/1978 | Suzuki | 375/112 |
| 4,242,755 | 12/1980 | Gauzan | 375/116 |
| 4,414,676 | 11/1983 | Kraul et al. | 375/116 |
| 4,430,652 | 2/1984 | Rothenbuhler et al. | 375/95 |

Primary Examiner—Robert L. Griffin
Assistant Examiner—Stephen Chin
Attorney, Agent, or Firm—Pollock, Vande Sande & Priddy

[57] ABSTRACT

Apparatus for decoding a serial data stream having remote control informations. Detector means for detecting a serial data stream containing said remote control data are provided to supply a microprocessor with serial data. The microprocessor employs the programming steps of sampling the data at a rate in excess of two times the data rate. The number of consecutive samples of zero bits between samples of a one bit are as counted. A register is loaded with a one bit every time a one is sampled, and loaded with a zero bit when the number of consecutive zeros exceed a predetermined number.

12 Claims, 11 Drawing Figures

FIG. 10 FLOWCHART-DATA DECODER

FIG. 11 SUB II FLOWCHART

MICROPROCESSOR CONTROLLED SYSTEM FOR DECODING SERIAL DATA INTO PARALLEL DATA FOR EXECUTION

BACKGROUND OF INVENTION

A system for decoding serial data is provided wherein binary digits of a data stream are converted into parallel data format. Specifically, decoding of remote control function data is provided without using synchronized clocks in the transmitter and receiver units.

Remote control systems for television receivers are in wide-spread use. Since 1974, The Magnavox Company has sold under the trademark name "Star" System television receivers with accompanying remote control units. The earlier remote control units were the ultrasonic type wherein a viewer at a distance away from the television receiver affects certain limited controls of the television receiver by sending ultrasonic signals across the room to the television receiver. The ultrasonic system has bandwidth limitations as well as problems associated with false triggering due to extraneous sources of ultrasonic energy.

Recently, infared light has been proposed as the medium for conveying information to a television receiver from a distance away from the receiver. The infared light system is more secure than the ultrasonic system, and further includes an increased capability for carrying more commands to the television receiver.

In conjunction with the use of infared light as a signaling medium, a Telco code converter for converting keyboard selected function data into a serial code has become available. N. V. Philips Company has manufactured and sold Telco code converters which provide a serial binary data stream including a start code followed by data bits. When the viewer selects on a hand-held remote control keyboard a particular function to be executed, such as on/off, volume up, volume down, or channel selection, the Telco code converter produces a serial code including the start code identifying the particular function selected.

At the receiver, the serial data which occurs in bursts of infared radiation is decoded into corresponding binary ones and zeros. The receiver executes the decoded binary data and the selected function is executed.

The serial data transmitted by a remote user of the television receiver occurs at an irregular interval at the discretion of the user. The serial data must be converted and placed into a parallel format for execution. Recently, microprocessors have been employed to accomplish control of television receiver functions such as tuning, volume, power/on, etc. In microprocessor controlled television receivers, the command for controlling the receiver passes through the microprocessor for execution. It is therefore desirable to provide for direct sampling and conversion of the received serial data by the microprocessor whereby the data can be executed once decoded.

SUMMARY OF THE INVENTION

It is an object of this invention to provide conversion of serial data into parallel format for execution under control of a microprocessor.

It is a more specific object of the invention to provide decoding of transmitted serial data by a microprocessor which samples the data, validates the data, and places the data in parallel format for execution by the same microprocessor.

In accordance with the invention, a source of received serial data is connected to an input port of a microprocessor for decoding. The microprocessor is controlled with an external clock which supplies timing and reference signals for the internal clock. The microprocessor is programmed to sample the incoming serial data at a rate of at least two (2) times the data rate. With the present invention, it is not required that the internal timing clock or sampling by synchronized in any way with the incoming serial data, but that the data rate remain within the predetermined relationship with respect to the sampling rate. Depending on the number of consecutive zeroes sampled, the data is determined to be a space or binary 0. A sample binary 1 is determined to be a binary 1.

In order to decode the serial data, two registers are provided by a microprocessor. An input port connected to receive the serial data is sampled at a rate at least two times the data rate. Each sample is determined to be a one or zero. A first register is provided to count consecutive samples of a first type, i.e. all binary 0s or 1s. When a transition from a sample of the first type is detected, a second register, having been preloaded with an initial number is shifted a number of places depending on the number in the first register. At the conclusion of the shifting of the second register, the first register is reset to count the net group of consecutive binary samples of the first type. The second register is thereafter loaded with new data which is the logical product of the shifted data in the second register. When all bits have been sampled, the serial data is stored in the second register in parallel format.

In one embodiment of the invention, a microprocessor is programmed to sample the data to determine whether a 1 or 0 is being received at a sample rate at least twice the data rate and to count the number of consecutive sampled 0 digits. By examining the number of consecutive 0s, it is possible to determine when a binary 1 or 0 has been received. The microprocessor provides first and second registers which contain the number of consecutive 0s detected during sampling, and the decoded data. For a given sampling rate, the microprocessor provides shifting of the data in the data register a number of places left each time a binary 1 is sampled and when at least two consecutive 0s have been previously detected. At the conclusion of sampling the binary 1 and shifting of the register, under control of the zeros register, the contents of the 0s register are reset to count the next group of consecutive zeros sampled and the data register is reloaded with new data which is a logical product of the existing contents of the data register. The sampling, counting of consecutive 0s, shifting the data register under control of the 0s register, and reloading data continues until all incoming data bits have been sampled. The data contained in the data register corresponds to the received serial data.

The contents of the data register at the completion of the decoding provide parallel format data identifying the decoded function for execution by other programming steps by the microprocessor at a later time during the microprocessor programming schedule.

With one embodiment of the invention the number of digits required for the data register is minimized by a unique programming code which limits shifting of the data in the data register to a maximum of one place to the left during one sample. Further, validation of receipt of a start code is provided. The unique Telco code which includes space bits between data bits is decoded wherein the space bits are discarded at the time the data bits are placed in the parallel format storage for later execution.

DESCRIPTION OF THE PREFERRED EMBODIMENTS

Figures 1, 2:
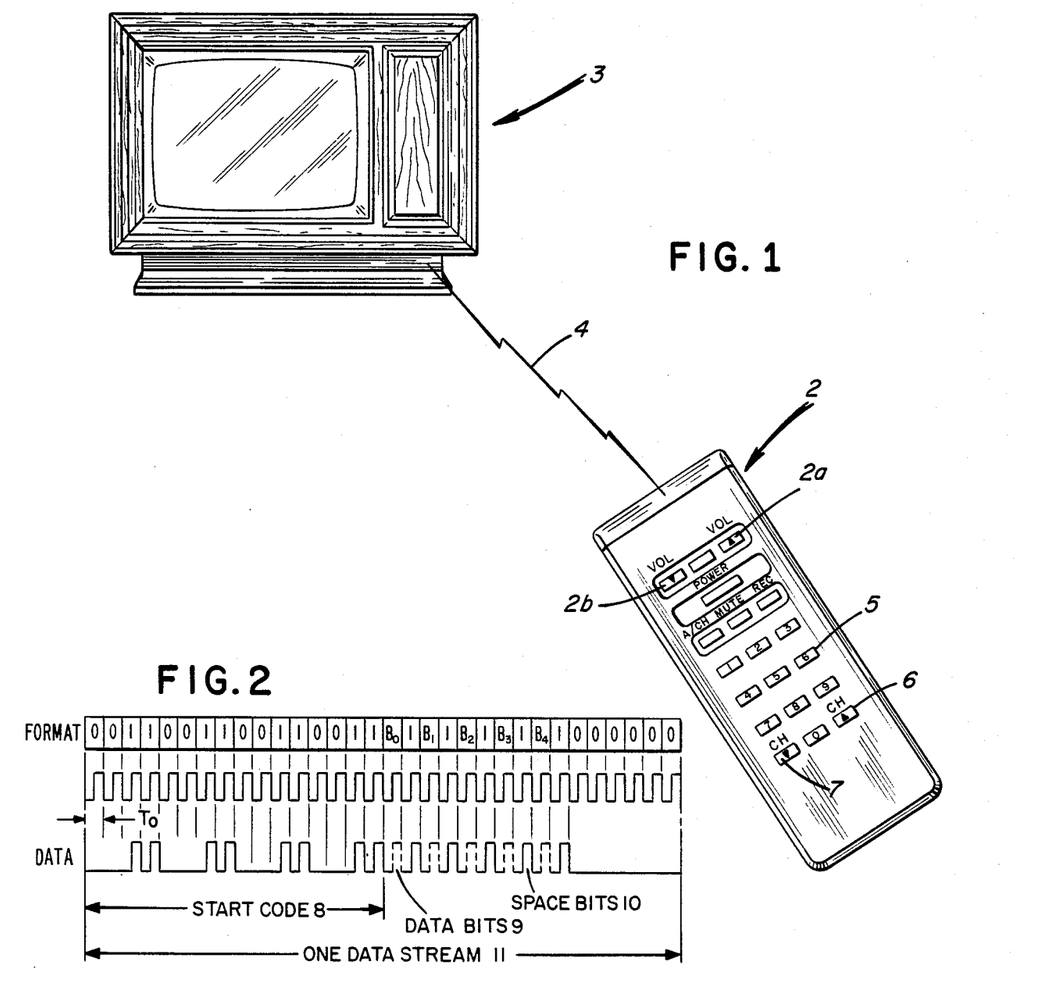
FIG. 1 shows the arrangement of a television receiver and remote control transmitter for effective control of the receiver functions.
FIG. 2 is illustrative of a Telco code transmitted by a remote control transmitter of FIG. 1.

Referring now to FIG. 1, there is shown a television receiver system having remote control. The system shown is of the Star (TM) System type as manufactured by the Magnavox Consumer Electronics Company. The remote control transmitter 2 controls all the functions of the television receiver 3 normally operated by a consumer. Two controls, 2a, 2b control the volume of the television receiver, one of them increasing the volume, the other decreasing the volume. A plurality of channel select keys 5 are provided on the transmitter to permit direct tuning of a selected channel number. Further, channel up 6 and channel down 7 controls are provided to permit a viewer to scan the available channels to determine a viewing channel preference. Commands from the transmitter 2 are sent via any infared light beam 4.

Referring now to FIG. 2 there is shown the code formed by infared energy bursts transmitted when a particular function is selected. As shown in FIG. 2, there is a start code 8 which consists of the hexidecimal number H'33'. Following the hexidecimal start code H'33' are a series of bits which include data bits 9 as well as interleaved space bits. The space bits 10 appear as solid lines separating individual digits of the data stream. The present invention comprises a method for sampling the entire data word including the start code 8 to determine if a one (1), zero (0), or space bit 10 is being received.

In accordance with one embodiment of the invention, the data stream 11 is sampled at a rate $2\frac{1}{2}$ times the data rate. Referring to FIGS. 3-6, an example of different data signals which can be received comprising a plurality of ones and zeros is shown, each separated by a space interval 12. Associated with each data signal is shown a sampling signal TS, 13 which is selected to be twice the frequency of the incoming data signal, and which is only loosely correlated in phase with the incoming signal.

Figure 3:
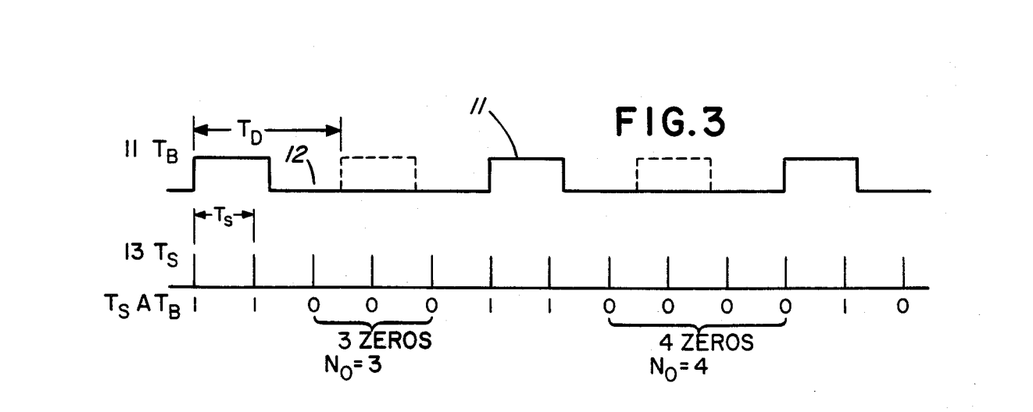
FIG. 3 is the possible data transmitted with respect to a sampling interval.

The data stream of FIG. 3 illustrates the situation where the data word to be detected is a plurality of alternating ones and zeros or 10101. The sampling of the data signal, TB, at $2\frac{1}{2}$ times the data rate indicates that two consecutive 1s, succeeeded by three consecutive 0s will be detected followed by two consecutive 1s, followed by four consecutive 0s, followed by 1 and finally a 0.

Figure 4:
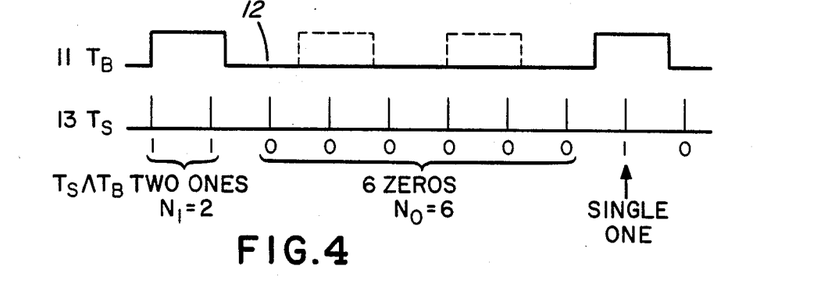
FIG. 4 shows another possible data configuration with respect to a sample interval.
Figure 5:
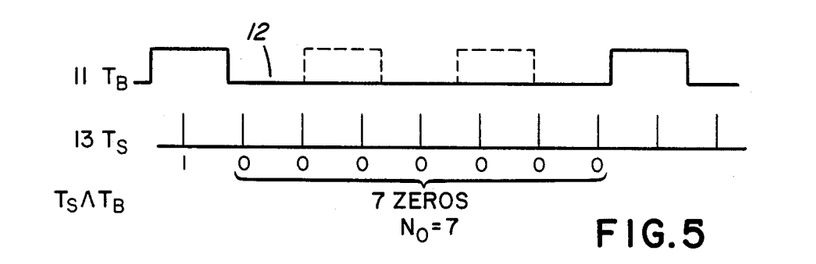
FIG. 5 shows yet another possible data transmission with respect to the same sampling interval.

Examining the data stream of FIG. 4, wherein the number 1001 is sampled, it is clear that with the corellation between sample intervals and 0s as shown, six consecutive 0s will be sampled followed by a single binary 1. In FIG. 5, the number 1001 is sampled again by the sampling signal TS at a slightly different phase with respect to the data signal. In this situation, seven consecutive 0s are detected.

Figure 6:
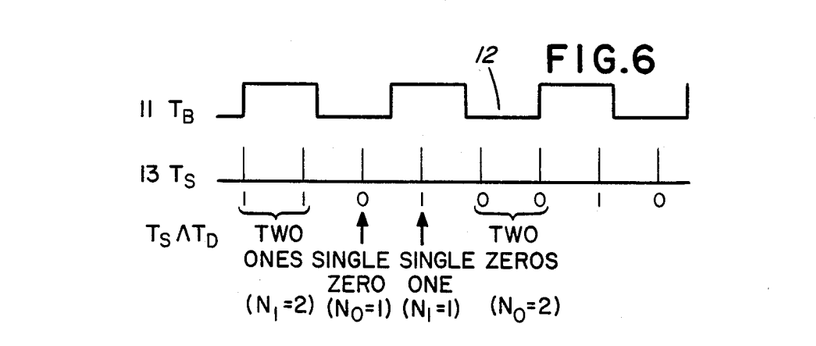
FIG. 6 shows yet another possible data transmission with respect to a sampling interval.

Finally, the signal of FIG. 6 including the number 111 is sampled. In this situation, two 1s are initially detected, followed by a single 0 representing an interval 12, followed by a single 1 representing a binary 1 and two 0s representing a second interval 12.

From the above described sampling sequences for different decoded data, there are certain rules which may be postulated identifying data as either a 0 or a 1 as follows:
If: N1 equals the number of successive binary "1"s N0 equals the number of successive binary "0"s
 (1) $1 \leq N1 \leq 2$ then data is a 1; $1 \leq N0 \leq 2$ then data is a space between data bits
 (2) $3 \leq N0 \leq 4$ then data is a 0
 (3) $6 \leq N0 \leq 7$ then data is 0,0
 (4) $7 < N0$ transmission terminated
 (5) $N1 > 2$ transmission error has occurred.

When demodulating the data, the above rules are applied to the sampled data stream. After applying the rules, a determination is made whether a 1 or a 0 has been received. The data is assembled in a register and the contents of the register represents the converted parallel format data of the data stream.

Figure 7:
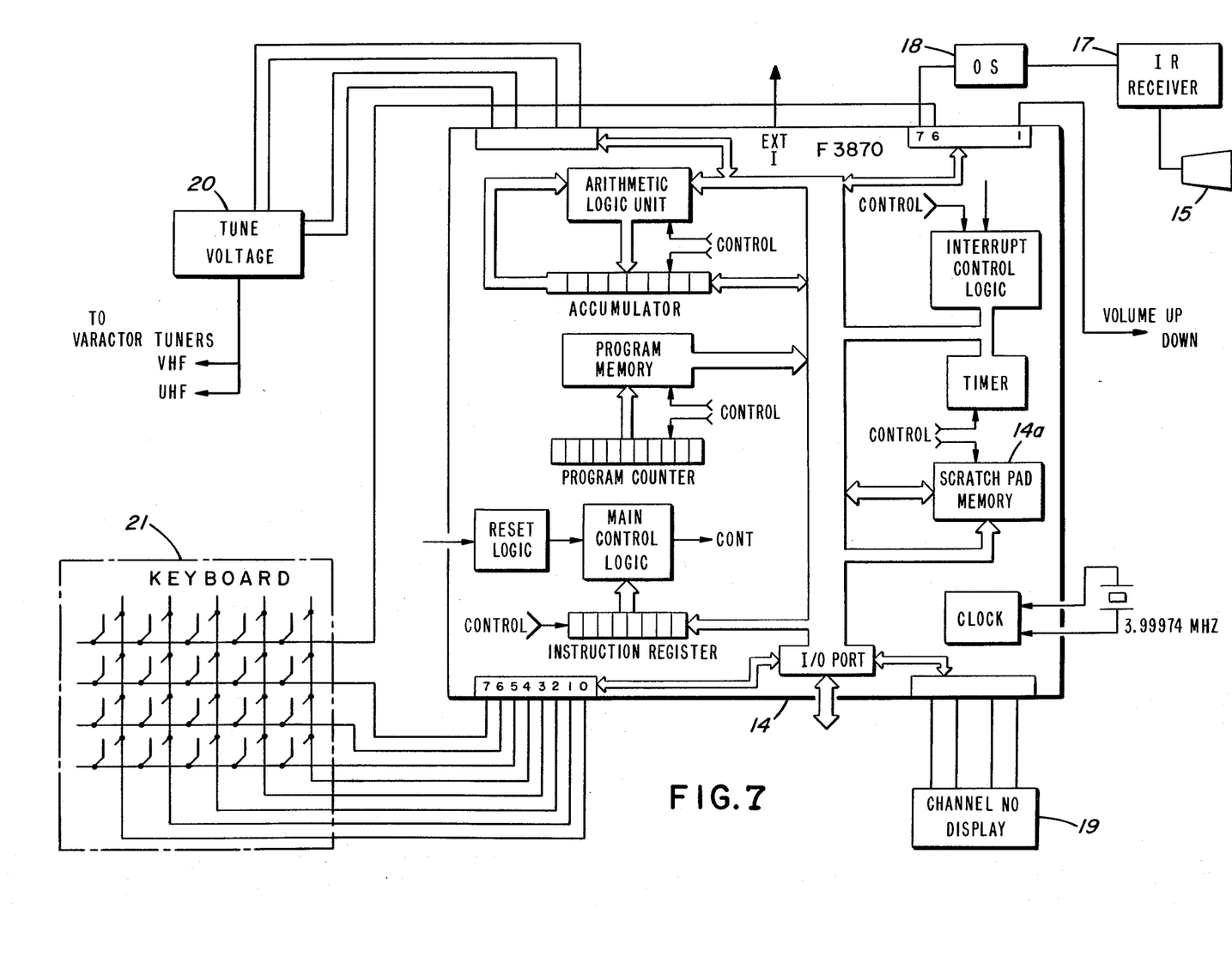
FIG. 7 illustrates the decoding apparatus for receiving encoded commands and decoding the commands into a parallel format data for execution.

Referring now to FIG. 7, there is shown a decoding apparatus for implementing the above rules. An infared radiation detector 15 detects the bursts of data incident to the television receiver. The infared energy is decoded in an infared receiver 17 to produce pulses corresponding to each burst of infared energy received. The one shot 18 is triggered every time a burst of infared energy is received. The Telco code of FIG. 2 therefore appears at the output of the one shot 18.

A F3870 microprocessor 14, made by Fairchild Industries, Inc. receives on its pin 7 the output of the one shot 18. The microprocessor unit is controlled by a crystal 20 having a frequency of 3.99974 MHZ. The crystal provides a time reference for the internal clock of the microprocessor 14.

Additional to the microprocessor 14 are a channel number display unit 19 and a keyboard 21 operating a plurality of functions select switches. The row and column number of each switch is decoded in a sub-routine of the microprocessor for determining the keyboard selection. The keyboard selection is made at the television receiver 3 and corresponds to the same available function selections on the remote control transmitter of FIG. 1. Also connected is a tuning voltage generator 20 selecting a voltage for one of two voltage controlled tuners in response to a command from the microprocessor. Both the tuning function, channel display 19 function, and keyboard 21 input are not part of the present invention, but are also accomplished by the same microprocessor 14 which carries out the decoding of remote control data.

Internal to the microprocessor 14 is a scratch pad memory 14a. The scratch pad memory 14a is programmed to contain in one embodiment of the invention first and second registers for storing multidigit binary numbers. The first register contains the number of consecutive 0s sampled prior to, and succeeding a sample of a binary 1. This register, known as the 0's register, counts the number of consecutive 0s sampled during receipt of a data stream. The second register in the scratch pad memory stores each decoded digit as the microprocessor 14 determines whether the digit is a 1 or a 0 after applying the aforesaid rules.

Figure 8:
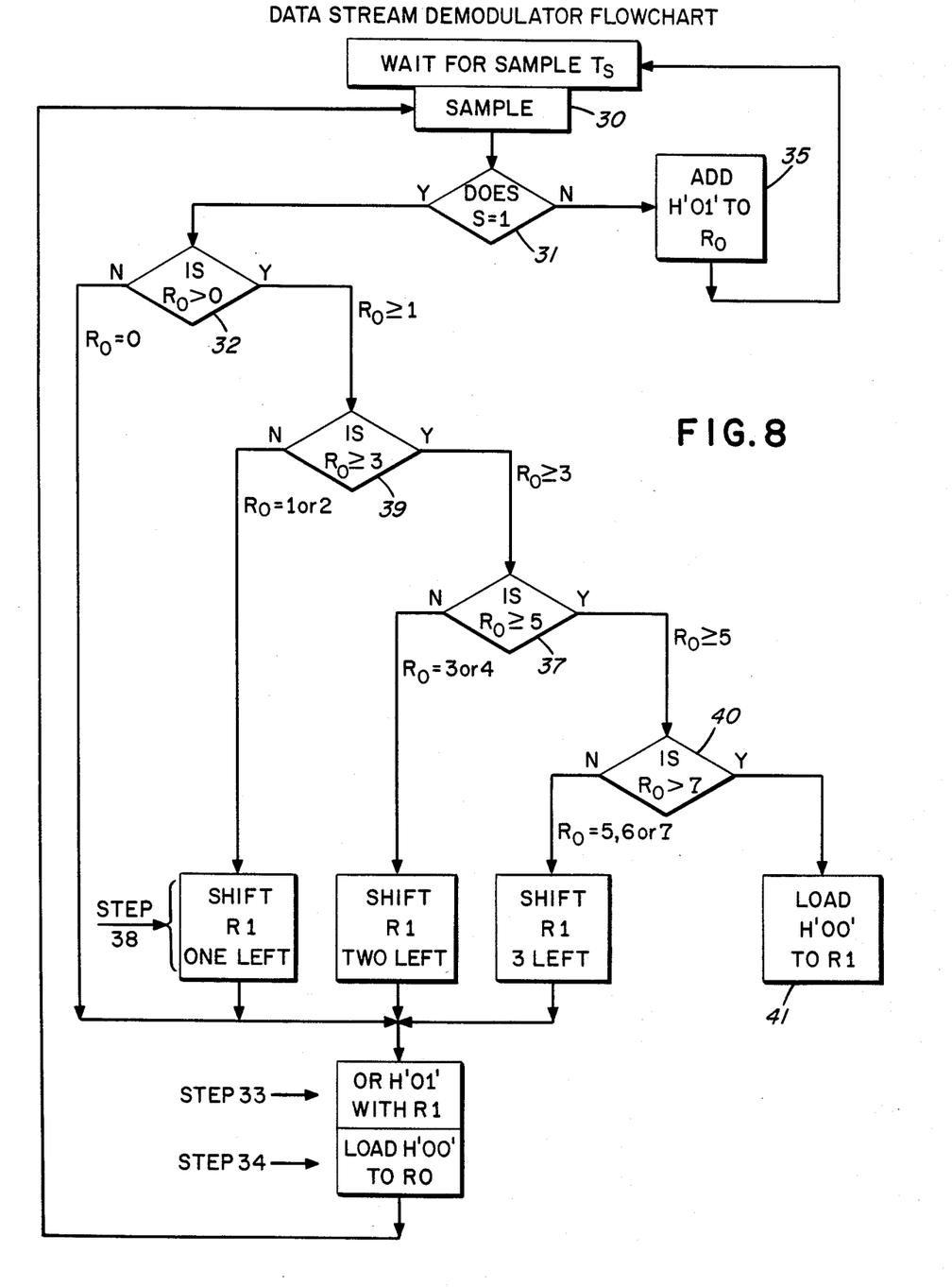
FIG. 8 shows a first flow chart for programming the microprocessor of FIG. 6.

Referring now to FIG. 8, there is shown a programming flow chart for implementing the aforesaid rules derived to decode the serial data stream. The first register which is formed from the scratch pad memory 14a holds the number of consecutive 0s and is designated in the flow chart as R0. The second register, holding the decoded data bits is designated R1. The second register is formed such that its contents may be shifted to the left at least three (3) places. Standard software techniques may be implemented to form the registers.

Figure 9:
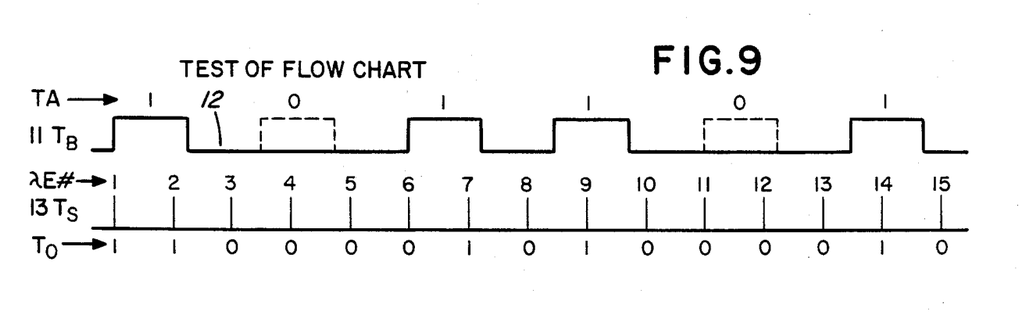
FIG. 9 shows an example of Telco data to be decoded.

The operation of the microprocessor 14 under control of the flow chart of FIG. 8 may be appreciated by referring to the example of FIG. 9. FIG. 9 illustrates decoding of the binary number 101101. The microprocessor 14 samples the information on input 7 at a rate which is 2½ times the approximate data rate of the remote control information being transmitted to the television receiver. The main programming steps of the microprocessor programming include steps 30 for sampling at pin 7 the data at 2½ times the data rate interval.

The sampling interval shown in FIG. 9 occurs approximately 2½ times for each data bit being sampled by the microprocessor 14 in step 30. Table one below illustrates the operation of the steps shown in FIG. 8 when decoding a data stream in accordance with FIG. 9.

TABLE 1

| SAM-PLE # | DATA TSXTP | STEP # | DATA REG (R1) 5 4 3 2 1 0 | ZEROS REG R0 5 4 3 2 1 0 | |
|---|---|---|---|---|---|
| 1 | 1 | 33,34 | 0 0 0 0 0 1 | 0 0 0 0 0 0 | |
| 2 | 1 | 33,34 | 1 | 0 0 0 | |
| 3 | 0 | 35 | 1 | 0 0 1 | - Hex 01 |
| 4 | 0 | 35 | 1 | 0 1 0 | |
| 5 | 0 | 35 | 1 | 0 1 1 | |
| 6 | 0 | 35 | 1 | 1 0 0 | |
| 7 | 1 | 38 | 1 0 0 | 1 0 0 | |
| | | 33 | 1 0 1 | 1 0 0 | |
| | | 34 | 1 0 1 | 0 0 0 | R (C) |
| 8 | 0 | | 1 0 1 | 0 0 1 | |
| 9 | 1 | 39,38 | 1 0 1 0 | 0 0 1 | |
| | | 33 | 1 0 1 1 | 0 0 1 | |
| | | 34 | 1 0 1 1 | 0 0 0 | R (C) |
| 10 | 0 | 35 | 1 0 1 1 | 0 0 1 | |
| 11 | 0 | 35 | 1 0 1 1 | 0 1 0 | |
| 12 | 0 | 35 | 1 0 1 1 | 0 1 1 | |
| 13 | 0 | 35 | 1 0 1 1 | 1 0 0 | |
| 14 | 1 | 38 | 1 0 1 1 0 0 | 1 0 0 | |
| | | 33 | 1 0 1 1 0 1 | 1 0 0 | |
| | | 34 | 1 0 1 1 0 1 | 0 0 0 | R (C) |

ENCODING DATA

TABLE 1-continued

| SAM-PLE # | DATA TSXTP | STEP # | DATA REG (R1) 5 4 3 2 1 0 | ZEROS REG R0 5 4 3 2 1 0 |
|---|---|---|---|---|
| IS NOW IN (R1) | | | | |

During the first sample interval, microprocessor 14 detects in step 31 "1". The contents of the consecutive zeros register R0 does not exceed 0, and therefore step 33 of the flow chart is executed. At this time, H'01' (the hexidecimal equivalent of 1) is ORed with the contents of R1. Therefore, register R1 is loaded with number 1. After concluding step 33, register R0 is loaded in step 34 with H'00' (the hexidecimal equivalent of 0). Thus, it is seen that after sample one is completed, the binary digit 1 is in register R1 and the 0s register R0 remains with zero as its content.

During the second sample, a binary 1 is also detected and the procedure is repeated following the flow chart of FIG. 8. Once sample three is detected, step 31 determines a 0 to be present in the data stream which from FIG. 9 corresponds to a bit interval 12. The bit interval 12 zero sample causes consecutive 0 register R0 to be incremented by one in step 35. As the fourth sample and fifth sample are also 0s, the 0 register R0 is incremented by each of these samples. The sixth sample of the data stream indicates that a 0 is sampled. The seventh sample is a 1, and following the flow chart of FIG. 8, since the number of 0s in register R0 is four as determined in step 37, R1 is shifted two places to the left in step 38. The flow chart thereafter indicates that steps 33 and 34 are executed as previously. Steps 39 and 40 are executed when the number of consecutive 0s which procedes a binary 1 are 1 or 2, and 5 or 6, respectively. It is clear from following the flow chart of FIG. 8 and Table 2 showing execution of the flow chart, with respect to the data being received according to FIG. 9, there will be in R1 a binary number equivalent to the serial number being sent, 101101.

The foregoing operation of the microprocessor 14 requires that the register R1 have sufficient capacity to permit the contents to be shifted as many as three places left. This requires that the scratch pad memory 14a have reserved therein a sufficient number of memory locations to permit the inserted data to be shifted as many as three places to the left when executing steps 39–41. In order to avoid the inadvertent loss of a digit which results from a data shift command during steps 38, 40 two or three places left, another program has been developed which requires that the contents of a register R1 be shifted to the left a maximum of one place during a sample. With such a program, it is possible to determine when register R1 is becoming filled to capacity, at which point programming steps may be implemented to augment the capacity of register R1 with additional capacity from an auxiliary register.

Figure 10:
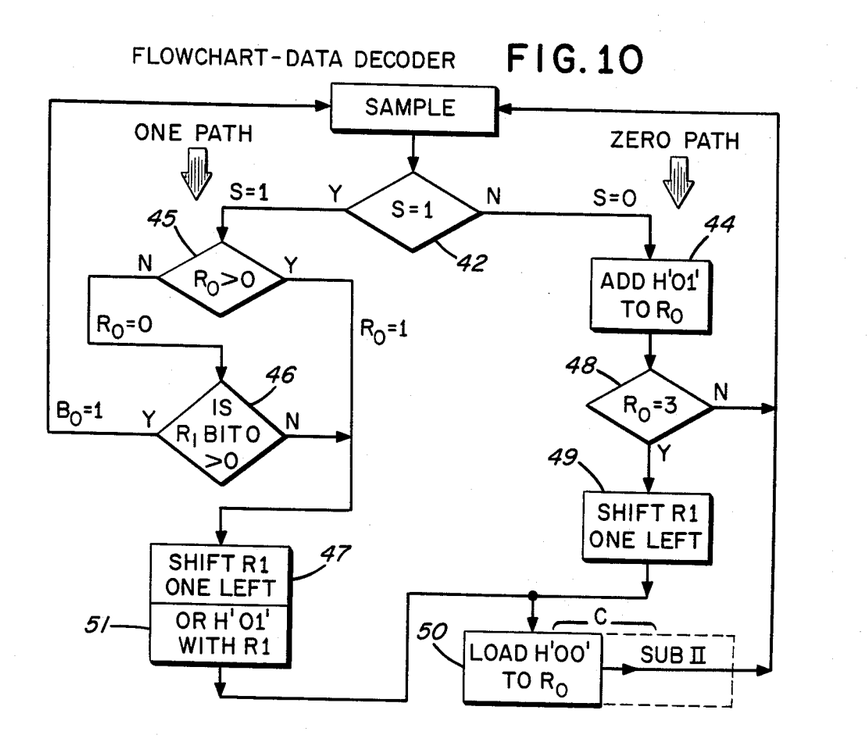
FIG. 10 shows yet another flow chart for decoding data minimizing the bit space requirements for the data register.

FIG. 10 illustrates another programming routine for the microprocessor 14 of FIG. 7 which shifts the contents of register R1 one place to the left thereby permitting detection of a condition that the register R1 capacity is being exceeded. This permits auxiliary registers to be used to carry the overflow. To provide shifting of register R1 only one bit left at a time, a new set of criteria is provided for determining when to shift register R1. With the previous criteria, as implemented by flow chart 8, the 0s register was allowed to accumulate the total number of binary 0s consecutively received prior to sampling a binary 1. The number of consecutive binary 0s in register R0 could result in register R1 being shifted three places left.

A new criteria can be established which determines when the total number of binary 0s, sampled equals three, indicating a shift of two places left. The following criteria therefore is sufficient to this determination:

If N1 = number of successive 1s sampled.
N0 = number of successive 0s sampled
(1) $1 \leq N1 \leq 2$ then data is a 1
(2) $1 \leq N0 \leq 2$ then data is an interval between data bits
(3) $3 \leq N0 \leq 5$ then data is a 0.

Thus, it is seen that it is only necessary to determine whether or not three successive 0 samples occur; and whether after receiving a binary 1, the R0 register exceeds 0 or the R1 register bit 0 exceeds 0.

Figure 11:
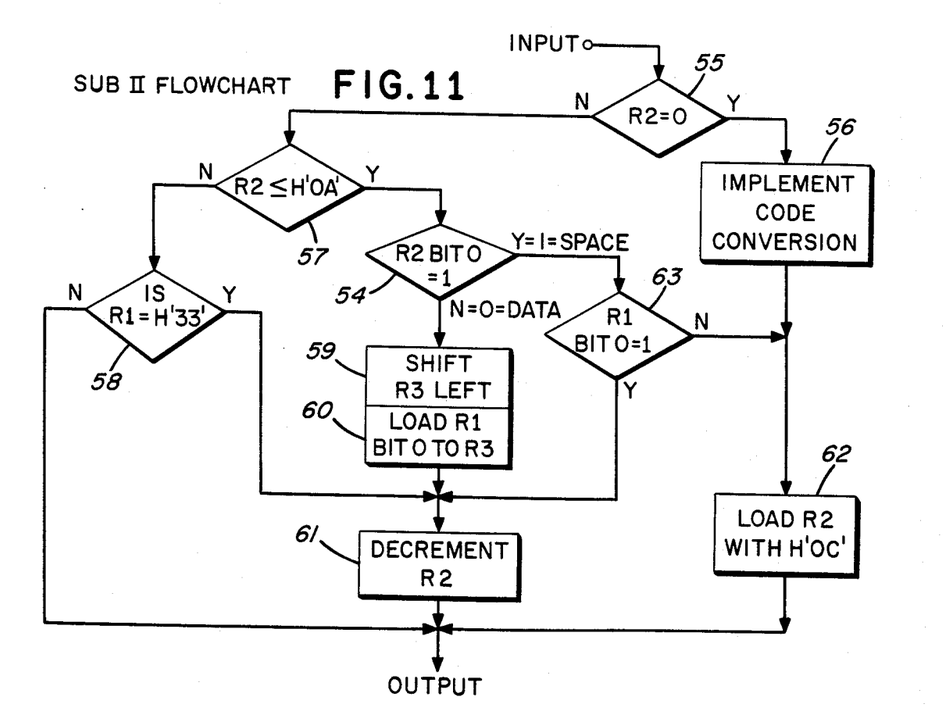
FIG. 11 shows a sub-routine for flow chart 2 to remove space bits and validate the code of a received data stream.

Referring now to FIG. 10, the sample is taken of the first digit received in step 42 and depending upon whether a 1 or 0 is detected, the 0 register R0 is incremented in step 44 or the data register R1 is shifted left as shown in the flow chart in steps 45, 46 and 47. The left side of the flow chart 10 illustrates the path taken by the programming when a 1 is detected. The right portion of the flow chart indicates the path taken when a 0 is detected. This path will shift R1 left and load H'00' in R0 in steps 48–50 when three consecutive 0s are detected. Referring to FIG. 11, there is shown a sub-routine which is implemented at the conclusion of each sample interval, when either a 1 or 0 is detected. The sub-routine flow chart requires that there be two more registers, R2, which is denoted an event counter, and R3 which holds the data derived from the flow chart 10. With the sub-routine of FIG. 11, the Telco code is validated, and following the start code detection, the space bits contained in the Telco code are removed and the decoded data, minus space bits, appears in register R3 within the microprocessor 14 of FIG. 7.

The operation of the flow chart of FIG. 10 and the sub-routine of FIG. 11 for the Telco word 0011001101010 will now be explained.

The first eight digits of the Telco code represents H'33', the start code for the Telco coded word. The data bits of the Telco word also include between each data bit a space bit as shown in the previous FIG. 2 for the Telco format. The sub-routine of the flow chart of FIG. 11 will validate receipt of H'33' as well as discard the space bits when loading R3 with the decoded Telco data.

The following Table 2 shows the status of registers R1, R0, R2, and R3 during execution of the flow chart of FIG. 10 for decoding the first 8 bits of the Telco word corresponding to H'33', which is sampled as 00110011.

TABLE 2

| SAMPLE # | DATA | STEP # | 7 6 5 4 R1 | 3 2 1 0 R1 | 3 2 1 0 R0 | 3 2 1 0 R2 | 3 2 1 0 R2 | 3 2 1 0 R3 |
|---|---|---|---|---|---|---|---|---|
| 0 | 0 |  |  | 0 0 0 0 | 0 0 0 0 | 1 0 1 1 | 1 1 | 0 0 0 0 |
| 1 | 0 | 44 |  |  | 1 |  |  |  |
| 2 | 0 | 44 |  |  | 1 0 |  |  |  |
| 3 | 0 | 44,49 | 0 0 0 0 | 0 0 0 0 | 1 1 |  |  |  |
|  |  | 50 | 0 0 0 0 | 0 0 0 0 | 0 0 0 0 |  |  |  |
| 4 | 0 | 44 | 0 0 0 0 | 0 0 0 0 | 0 0 0 1 |  |  |  |
| 5 | 0 | 44 | 0 0 0 0 | 0 0 0 0 | 0 0 1 0 |  |  |  |
| 6 | 1 | 47,51 | 0 0 0 0 | 0 0 0 1 | 0 0 1 0 |  |  |  |
|  |  | 50 |  | 0 0 0 1 | 0 0 0 0 |  |  |  |
| 7 | 1 |  |  | 0 0 0 1 | 0 0 0 0 |  |  |  |
| 8 | 0 | 44 |  | 0 0 0 1 | 0 0 0 1 |  |  |  |
| 9 | 1 | 47,51 |  | 0 0 1 1 | 0 0 0 1 |  |  |  |
|  |  | 50 |  | 0 0 1 1 | 0 0 0 0 | 1 0 1 1 |  |  |
| 10 | 0 | 44 |  | 0 0 1 1 | 0 1 |  |  |  |
| 11 | 0 | 44 |  | 0 0 1 1 | 1 0 |  |  |  |
| 12 | 0 | 44 |  | 0 0 1 1 | 1 1 |  |  |  |
|  |  | 49 |  | 0 1 1 0 | 1 1 |  |  |  |
|  |  | 50 |  | 0 1 1 0 | 0 0 |  |  |  |
| 13 | 0 | 44 |  | 0 1 1 0 | 0 1 |  |  |  |
| 14 | 0 | 44 |  | 0 1 1 0 | 1 0 |  |  |  |
| 15 | 0 | 44 |  | 0 1 1 0 | 1 1 |  |  |  |
|  |  | 49 |  | 1 1 0 0 | 1 1 |  |  |  |
|  |  | 50 | 0 0 0 0 | 1 1 0 0 | 0 0 |  |  |  |
| 16 | 1 | 47 | 0 0 0 1 | 1 0 0 0 | 0 0 |  |  |  |
|  |  | 51,50 | 0 0 0 1 | 1 0 0 1 | 0 0 |  |  |  |
| 17 | 1 |  | 0 0 0 1 | 1 0 0 1 | 0 0 |  |  |  |
| 18 | 0 | 44 | 0 0 0 1 | 1 0 0 1 | 0 1 |  |  |  |
| 19 | 1 | 47,51 | 0 0 1 1 | 0 0 1 1 | 0 1 |  |  |  |
|  |  | 50 | 0 0 1 1 | 0 0 1 1 | 0 0 | 1 0 1 1 | 1 1 |  |
|  |  | 61 | 0 0 1 1 | 0 0 1 1 | 0 0 | 1 0 1 0 | 1 0 | 0 0 0 0 |
|  |  |  | 3 | 3 |  |  |  |  |

During the first three samples no 1 bits are detected in steps 42, and R0 is incremented to the number 3 (binary 11) in step 44. The fourth sample similarly includes detection of a 0, however in accordance with the programming steps of the zero path of FIG. 10 when R0 = 3 in step 48, the contents of R1, the initial data register, are shifted left one place and following the shift left in step 49 of R1, H'00' is loaded in R0 to establish a new 0 setting for the 0s register R0 in step 50. Samples 6 and 7 represent the first binary 1s detected during the sampling intervals whereby the left path of FIG. 10 is followed executing steps 47 and 51.

The programming steps of the flow chart of FIG. 10 are carried out until the entire start code H'33' is stored in register R1. At this time, the Telco start code is validated in step 58 of the subroutine of FIG. 11 and register R2, the event counter, is decremented in step 63 as the subroutine in FIG. 11 is executed. Register R2 has been previously loaded with the hexidecimal equivalent of 12, H'OC' thereby counting 12 events as they occur. Table 3 shows the contents of the respective registers R0, R1, R2, and R3 when the first five bits of the data portion of the Telco word are being decoded. The first five bits sampled of the Telco code are as follows.

| TELCO CODE | START 1 | DATA 1 0 | SPACE 1 1 | DATA 2 1 | SPACE 1 1 | DATA 3 0 | SPACE 1 1 | DATA 4 1 | SPACE 1 1 | DATA 5 0 | SPACE 1 |
|---|---|---|---|---|---|---|---|---|---|---|---|
| SAMPLE NO. | 1 2 | 3 4 5 | 6 7 | 8 9 10 | 11 12 | 13 14 15 | 16 17 18 | 19 | 20 21 22 | 23 24 25 | 26 27 | 28 29 30 |
| DATA | 1 1 | 0 0 0 | 1 1 | 0 1 0 | 0 1 | 0 0 0 | 0 1 0 | 1 | 0 1 1 | 0 0 0 | 1 1 | 0 0 0 |

The data portion of the Telco code includes space bits between the data bits as previously described with respect to the Telco word format, the first data bit been preceded by H'33'.

The first sample when detecting the first bit of the Telco data portion, is the sample of a start code bit appearing before the first data bit as occurs in the Telco format data. Sample 4 of the data portion of the Telco code represents the first sample of a data bit. As is shown in the accompanying Table 3, wherein the contents of R2 are shown in decimal as well as binary form, R2 decrements every time a space bit is detected in steps 54 and 61. Further, steps 59 and 60 load R3 with the data word minus the space bits. At the conclusion of the sample, the completed code conversion for the first data bit is in register R3.

The remaining steps of the subroutine of FIG. 11 are used to validate the start code H'33' in step 58 while removing space bits from the data loaded in R3. The event counter R2 is loaded initially by step 62 with H'OC' (decimal 12). During each pass through the subroutine of FIG. 11, the event counter R2 is decremented after the start code has been validated in step 58. When the first data bit, which follows in the Telco format the start code, is sampled, R2 must be equal to H'OA' in step 57, and the R2 bit 0 must be zero in step 54. If these conditions hold, then steps 59 and 60 shift and load data into R3. When a space bit is sampled, step 63 bypasses steps 59 and 60 keeping space bits from R3.

When R2 has been decremented to 0, indicating complete decoding of the data portion of the Telco code, steps 55 and 56 hold the code for execution by the microprocessor 14 during a later stage of the microprocessor 14 timing cycle.

Thus, there has been described with respect to two (2) embodiments a microprocessor system for decoding serial data into a parallel format. This permits execution of the recovered data with subsequent programming steps within the microprocessor. In the preferred embodiment, there are provisions for validating the start code as well as moving space bits which occur during receipt of the data portion of a Telco bit.

Those skilled in the art will recognize still other embodiments of the invention more particularly described in the claims which follow.

TABLE 3

| SAMPLE # | DATA | STEP # | 7654 R1 | 3210 R1 | 3210 R0 | 3210 R2 | (D) R2 | 3210 R3 | |
|---|---|---|---|---|---|---|---|---|---|
| 1 | 1 | 47,51,50 | 0011 | 0011 | 0000 | 1011 | 11 | 0000 | Test of Sub II |
| | | 61 | 0011 | 0011 | 0000 | 1010 | 10 | | for Data Bit |
| 2 | 1 | | 0011 | 0011 | 00 | 1010 | 10 | | Decoding |
| 3 | 0 | 44 | 0011 | 0011 | 01 | 1010 | 10 | | |
| 4 | 0 | 44 | 0011 | 0011 | 10 | 1010 | 10 | | |
| 5 | 0 | 44 | 0011 | 0011 | 11 | 1010 | 10 | | |
| | | 49 | 0110 | 0110 | 11 | 1010 | 10 | | |
| | | 50 | 0110 | 0110 | 00 | 1010 | 10 | 0000 | Data Bit 1 |
| | | 59 | 0110 | 0110 | 00 | 1010 | 10 | 0000 | |
| | | 60 | 0110 | 0110 | 00 | 1010 | 10 | 0000 | |
| | | 61 | 0110 | 0110 | 00 | 1001 | 9 | 0000 | |
| 6 | 1 | 47,51,50 | 1100 | 1101 | 00 | 1001 | 9 | 0000 | |
| | | 61 | 1100 | 1101 | 00 | 1000 | 8 | 0000 | Space Bit 1 |
| 7 | 1 | — | 1100 | 1101 | 00 | 1000 | 8 | 0000 | |
| 8 | 0 | 44 | 1100 | 1101 | 01 | 1000 | 8 | 0000 | |
| 9 | 1 | 47,51,50 | 1001 | 1011 | 00 | 1000 | 8 | 0000 | |
| | | 59 | 1001 | 1011 | 00 | 1000 | 8 | 0000 | |
| | | 60 | 1001 | 1011 | 00 | 1000 | 8 | 0001 | Data Bit 2 |
| | | 61 | 1001 | 1011 | 00 | 0111 | 7 | 0001 | |
| 10 | 0 | 44 | 1001 | 1011 | 00 | 0111 | 7 | 0001 | |
| 11 | 0 | 44 | 1001 | 1011 | 10 | 0111 | 7 | 0001 | |
| 12 | 1 | 47,51,50 | 0011 | 0111 | 00 | 0111 | 7 | 0001 | |
| | | 61 | 0011 | 0111 | 00 | 0110 | 6 | | Space Bit 2 |
| 13 | 0 | 44 | 0011 | 0111 | 01 | 110 | 6 | | |
| 14 | 0 | 44 | 0011 | 0111 | 10 | 110 | 6 | | |
| 15 | 0 | 44 | 0011 | 0111 | 11 | 0110 | 6 | | |
| | | 49,50 | 0110 | 1110 | 00 | 0110 | 6 | 0001 | |
| | | 59 | 0110 | 1110 | 00 | 0110 | 5 | 0010 | Data Bit 3 |
| | | 60,61 | 0110 | 1110 | 00 | 0101 | 5 | 0010 | |
| 16 | 0 | 44 | 0110 | 1110 | 01 | 0101 | 5 | 0010 | |
| 17 | 1 | 47,51,50 | 1101 | 1101 | 00 | 0101 | 5 | 0010 | Space Bit 3 |
| | | 61 | 1101 | 1101 | S300 | 0100 | 4 | 0010 | |
| 18 | 0 | 44 | 1101 | 1101 | 01 | 0100 | 4 | 0010 | |
| 19 | 1 | 47,51,50 | 1011 | 1011 | 00 | 0100 | 4 | 0010 | |
| | | 59 | 1011 | 1011 | 00 | 0100 | 4 | 0100 | |
| | | 60 | 1011 | 1011 | 00 | 0100 | 4 | 0101 | Data Bit 4 |
| | | 61 | 1011 | 1011 | 0000 | 0011 | 3 | | |
| 20 | 0 | 44 | 1011 | 1011 | 0001 | 0011 | 3 | | |

TABLE 3-continued

| SAMPLE # | DATA | STEP # | 7654 R1 | 3210 R1 | 3210 R0 | 3210 R2 | (D) R2 | 3210 R3 | |
|---|---|---|---|---|---|---|---|---|---|
| 21 | 1 | 47,51 | 0111 | 0111 | 0001 | 0011 | 3 | | |
| | | 50 | 0111 | 0111 | 0000 | 0011 | 3 | 54 | Space Bit 4 |
| | | 61 | 0111 | 0111 | 0000 | 0010 | 2 | | |
| 22 | 1 | | 0111 | 0111 | 0000 | 0010 | 2 | | |
| 23 | 0 | 44 | 0111 | 0111 | 0001 | 0010 | 2 | | |
| 24 | 0 | 44 | 0111 | 0111 | 0010 | 0010 | 2 | | |
| 25 | 0 | 44 | 0111 | 0111 | 0011 | 0010 | 2 | | |
| | | 49 | 1110 | 1110 | 0011 | 0010 | 2 | 00101 | |
| | | 50 | 1110 | 1110 | 0000 | 0010 | 2 | 00101 | Data Bit 5 |
| | | 59 | 1110 | 1110 | 0000 | 0010 | 2 | 01010 | |
| | | 60 | 1110 | 1110 | 0000 | 0010 | 2 | 01010 | |
| | | 61 | 1110 | 1110 | 0000 | 0001 | 1 | 01010 | |
| 26 | 1 | 47,51,50 | 1101 | 1101 | 0000 | 0001 | 1 | 01010 | |
| | | 61 | 1101 | 1101 | 0000 | 0000 | 0 | 01010 | Space Bit 5 |
| 27 | 1 | | 1101 | 1101 | 0000 | 0000 | 0 | 01010 | |
| 28 | 0 | 44 | 1101 | 1101 | 0001 | 0000 | 0 | 01010 | |
| 29 | 0 | 44 | 1101 | 1101 | 0010 | 0000 | 0 | 01010 | |
| 30 | 0 | 44 | 1101 | 1101 | 0011 | 0000 | 0 | 01010 | |
| | | 49 | 1011 | 1010 | 0011 | 0000 | 0 | 01010 | |
| | | 50 | 1011 | 1010 | 0000 | 0000 | 0 | 01010 | |
| | | 55 | 1011 | 1010 | 0000 | 0000 | 0 | 01010 | Code conversion |
| | | 62 | 1011 | 1010 | 0000 | 1100 | 12 | 01010 | Load R2=H'OC' |

What is claimed is:

1. An apparatus for decoding remote control data comprising:
   detector means for detecting a serial data stream containing said remote control data;
   a microprocessor connected to receive said serial data stream, said microprocessor including the programming steps of:
   (a) determining at a sample rate at least twice the data rate whether a binary one or zero is being received by the microprocessor;
   (b) counting the number of consecutive samples of zero bits between each sample of a one bit; and
   (c) inserting into a register data determined by said sampling and counting a zero bit being inserted each time said number of consecutive zero bits exceeds a constant N1, and a one is stored each time a one bit is sampled.

2. An apparatus for providing parallel format data from a serial binary data stream comprising:
   means for sampling said data stream at a rate at least twice the rate of said data stream, said means providing an indication of whether a binary one or zero is sampled;
   a first register for counting the number of sampled consecutive binary digits which are the same;
   a second register for storing data;
   means for incrementing said first register every time consecutive binary digits of one type are sampled;
   means for shifting the contents of said second register if the number in said first register exceeds a predetermined count each time a transition from said consecutive digits is sampled; and
   means for inserting first and second numbers in said first and second registers after each transition from said digit of one type is sampled, whereby after the conclusion of a number of samples related to the number of data bits in said stream said second register contains said data stream.

3. An apparatus for providing parallel format data form a serial data stream comprising:
   means for sampling said serial data stream at an interval at least twice the rate of said serial data stream, said means providing an indication whether a binary one or zero is being received;
   a first register for storing a number as contents corresponding to the number of consecutive zeros sampled;
   a second register for storing data as contents, said register being shiftable whereby said stored data is shifted left in response to a command;
   means for loading an initial number in said first and second registers after a first binary one is sampled;
   means for shifting the contents of said second register left in response to the detection of a subsequent binary one a number of places determined by the contents of said first register; and
   means for resetting the contents of said first register to said initial number when subsequent binary ones are sampled and said second register to a number which is the logical product of its shifted contents, whereby each consecutive sample which produces a zero is counted in said first register and each sample which produces a binary one shifts the contents of said second register left according to the number of zeros stored in said first register whereby at the conclusion of a predetermined number of samples said data stream is stored in second register.

4. An apparatus for decoding a data stream comprising:
   means for supplying a serial data stream including start bits and information bits separated by spaces;
   means for sampling each of said bits and spaces to determine whether a one or zero is being received,
   a first register for storing the number of successive zeros sampled in said data stream;
   a second register for receiving and shifting data leftward to form said data stream;
   microprocessor means connected to said first and second registers for inserting data in said registers and shifting the contents of said second register; said microprocessor being programmed to:
   count the number of consecutive zeros sampled in said first register;
   shift the contents of said second register leftward depending upon the count of said first register, whereby said second register digits are shifted leftward one place when the number of consecutive zeros equal 1 or 2; and two places when said number of zeros equal 3 or 4;

combine the hexidecimal value of '01' with the contents of said second register in a logical OR operation after shifting said second register contents; and load the hexidecimal value of '00' into said first register whereby said first register is initialized, and said second register contains said decoded data.

5. An apparatus for decoding a data stream containing modulated binary data on a carrier, comprising:

means for demodulating said data stream from said carrier;

a microprocessor having one input port connected to receive said data stream from said means for demodulating, and an external clock connected to provide clocking pulses; said microprocessor including;

means programmed for sampling said port at a rate at least twice the data rate;

means for storing a number corresponding to the number of consecutive zeros sampled at said input port;

means for storing detected data bits, said means including a shift register for shifting stored data bits to the left;

said microprocessor including the program steps of:

updating said means for storing consecutive zeros after each consecutive zero is detected;

comparing the contents of said means for storing consecutive zeros with a first number N1, second number N2 and third number N3 each time a binary 1 is sampled;

shifting each of said data bits stored in said shift register one, two or three places to the left when said number of consecutive zeros exceeds (N1), (N2) or (N3), respectively;

providing a logical OR function with the contents of said register and the hexidecimal value of '01'; and loading the hexidecimal value of '00' into said means for storing a number of consecutive zeros after shifting said contents;

whereby said means for storing consecutive zeros is reset when each binary one is received, and said shift register contents are shifted left depending upon the number of consecutive zeros previously detected arranging said data stream in said shift register in a parallel format.

6. The apparatus of claim 5 further programmed to load hexidecimal value of '00' in said shift register when the contents of said means for storing exceeds (N3+1).

7. An apparatus for decoding serial digital data for execution by a programmed machine comprising:

a demodulator for removing said serial digital data from a carrier signal;

a microprocessor connected to receive on an input port said digital data from said demodulator, said microprocessor including first and second registers for storing data according to internal program instructions, said microprocessor being connected to provide a repetitive sampling of binary signals appearing at said input port, said microprocessor including program steps for arranging data in said second register by:

comparing a binary signal at said input port to determine whether a 1 or 0 is present;

storing in said first register the number of consecutive zeros sampled;

in the case a 1 is sampled, determining whether the number in said first register exceeds zero;

determining whether or not the 0 bit in said second register exceeds 0 when said first register contents are zero;

shifting the contents of said second register one digit left when said first register contents exceed zero, or when said second register 0' bit is a zero and said first register contents equals zero;

providing a logical OR function of the contents of said second register and the hexidecimal value of '01', the results of said function being inserted in said second register; and loading the hexidecimal value of '00' in said first register.

8. The apparatus of claim 5 wherein said microprocessor adds the hexidecimal value of '01', to said first register when a zero binary signal is sampled, shifts said second register one position left if the contents of said first register exceeds 3; and loads the hexidecimal value of '00' in said first register after shifting said second register 1 position left.

9. A method for decoding a serial binary data stream to provide said data in parallel format comprising:

sampling each bit in said data stream at a regular interval greater than twice the rate of said data;

counting in a first register the number of consecutive zeros being sampled;

comparing the number of zeros counted in said first register with a number N, each time a binary 1 is sampled;

shifting the contents of a second register one digit left whenever a binary 1 is received and the number in said first register exceeds N;

shifting the contents of said second register one position left when said first register number is less than N, and said first digit of said second register is zero;

providing a logical OR function between the contents of said second register with the hexidecimal value of '01' after a one has been sampled and said second register has been shifted in response thereto;

comparing the contents in said first register with a second number N2 each time said first register counts a consecutive zero;

shifting the contents of said second register one position left when the number in said first register exceeds N2; and, loading the hexidecimal value of '00' into said first register after the logical OR function is completed or after the number in said first register exceeds N2;

whereby at the conclusion of said serial data stream, said second register contains in parallel format digits representing said data stream.

10. The method of claim 7 wherein said method includes modifying said parallel format data, by deleting space bits contained therein and storing said modified data in a third register.

11. The method of claim 9 further comprising validating said sampled data bits.

12. The method of claim 9 further comprising the steps of:

storing in a third register the number N3;

comparing the number in said third register with the hexidecimal value of 'A';

decreasing by one the count in said third register when the number in the third register is less than the hexidecimal value of 'A', and when the number in the second register equals N4 indicating said data to be valid;

shifting the contents of a fourth register left one place when the zero bit in said third register is not equal to 1 and the contents in said third register are less than or equal to the hexidecimal value of 'A';

loading the zeroth bit of said second register into said fourth register;

decrementing said third register after loading said fourth register;

decrementing said third register when the contents of said third register are less than the hexidecimal value of '0A', said third register zero bit equals 1, and said second register zeroth bit is one;

loading into said third register the hexidecimal value of '0C' when said third register number is less than the hexidecimal value of 'A' said third register zeroth bit equals 1 and said second register zeroth bit equals 0;

whereby during each sampling period the data code is verified, the data in said second register is loaded in said fourth register without said space bits contained in said data code.

* * * * *